US010663116B2

(12) United States Patent
Veldman et al.

(10) Patent No.: US 10,663,116 B2
(45) Date of Patent: May 26, 2020

(54) LIGHTING DEVICE WITH DISPENSER FOR A REACTIVE SUBSTANCE

(71) Applicant: SIGNIFY HOLDING B.V., Eindhoven (NL)

(72) Inventors: Dirk Veldman, Eindhoven (NL); Rifat Ata Mustafa Hikmet, Eindhoven (NL); Ties Van Bommel, Eindhoven (NL); Wijnand Evert Jacobus Van Kooten, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 268 days.

(21) Appl. No.: 15/553,403

(22) PCT Filed: Feb. 16, 2016

(86) PCT No.: PCT/EP2016/053259
§ 371 (c)(1),
(2) Date: Aug. 24, 2017

(87) PCT Pub. No.: WO2016/135008
PCT Pub. Date: Sep. 1, 2016

(65) Prior Publication Data
US 2018/0128428 A1    May 10, 2018

(30) Foreign Application Priority Data

Feb. 26, 2015  (EP) .................................... 15156778
Nov. 23, 2015  (EP) .................................... 15195790

(51) Int. Cl.
*F21K 9/232*    (2016.01)
*F21V 25/00*    (2006.01)
(Continued)

(52) U.S. Cl.
CPC ............ *F21K 9/232* (2016.08); *C23C 16/455* (2013.01); *F21K 9/27* (2016.08); *F21K 9/90* (2013.01);
(Continued)

(58) Field of Classification Search
USPC .......................................................... 362/84
See application file for complete search history.

(56) References Cited

U.S. PATENT DOCUMENTS 3,548,240 A   12/1970  Spiessens
3,946,272 A    3/1976  Young
(Continued)

FOREIGN PATENT DOCUMENTS

CN    205821449 U    12/2016
EP      1255148 A2    11/2002
(Continued)

*Primary Examiner* — Anh T Mai
*Assistant Examiner* — Jessica M Apenteng
(74) *Attorney, Agent, or Firm* — Daniel J. Piotrowski

(57) ABSTRACT

A lighting device (100, 300, 400) is disclosed. The lighting device comprises a light source (110, 310, 410), an at least partially light transmitting envelope (120, 320, 420) and a dispenser (140, 340, 440). The envelope is arranged to define a sealed space (130, 330, 430) in which at least a portion of the light source is arranged. Further, the dispenser comprises a chemically reactive substance and is adapted to gradually release at least some of the chemically reactive substance to the sealed space so as to reduce contaminants and by-products that may be present in the sealed space.

14 Claims, 3 Drawing Sheets

(51) Int. Cl.
    *F21K 9/90* (2016.01)
    *F21K 9/27* (2016.01)
    *F21V 29/65* (2015.01)
    *F21V 29/85* (2015.01)
    *C23C 16/455* (2006.01)
    *F21V 31/00* (2006.01)
    *H01J 61/26* (2006.01)
    *H01J 61/28* (2006.01)
    *F21Y 113/17* (2016.01)
    *F21V 29/506* (2015.01)
    *F21Y 107/00* (2016.01)
    *F21Y 115/10* (2016.01)

(52) U.S. Cl.
    CPC .............. *F21V 25/00* (2013.01); *F21V 29/65* (2015.01); *F21V 29/85* (2015.01); *F21V 31/005* (2013.01); *H01J 61/26* (2013.01); *H01J 61/28* (2013.01); *F21V 29/506* (2015.01); *F21Y 2107/00* (2016.08); *F21Y 2113/17* (2016.08); *F21Y 2115/10* (2016.08)

(56) References Cited

U.S. PATENT DOCUMENTS

2014/0185269 A1\* 7/2014 Li ........................... H01L 33/50
                                                                                         362/84

2014/0268822 A1    9/2014 Olsson et al.

FOREIGN PATENT DOCUMENTS

| GB | 473583 A | 10/1937 |
| --- | --- | --- |
| GB | 1382672 A | 2/1975 |
| JP | 2000504476 A | 4/2000 |
| WO | WO2011006811 A1 | 1/2011 |
| WO | WO2012042428 A2 | 4/2012 |
| WO | WO2013154932 A1 | 10/2013 |
| WO | WO2014045489 A1 | 3/2014 |
| WO | WO2014093703 A1 | 6/2014 |
| WO | WO2015053076 A1 | 4/2015 |

\* cited by examiner

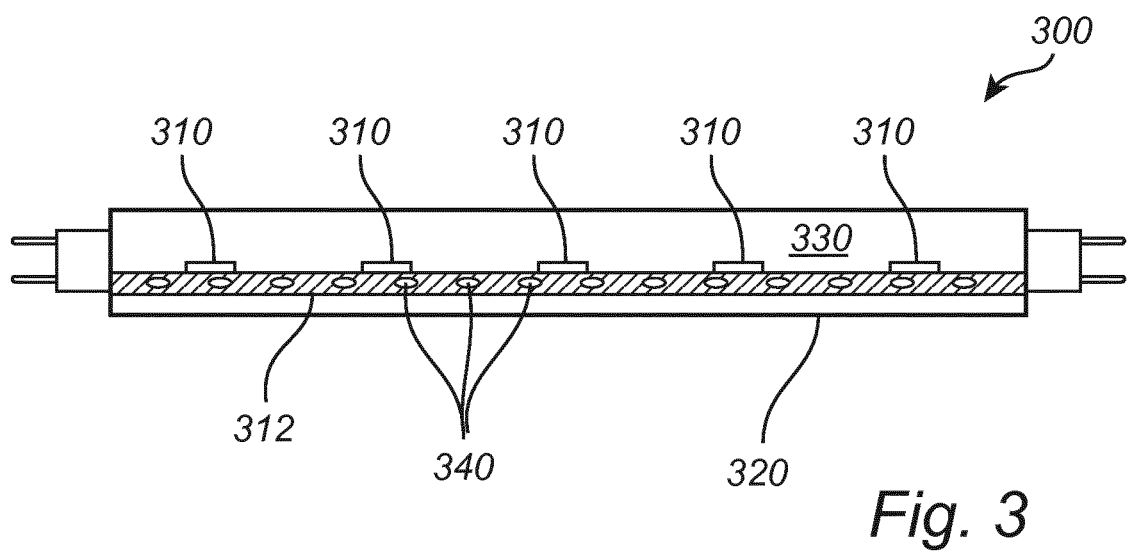
Fig. 3
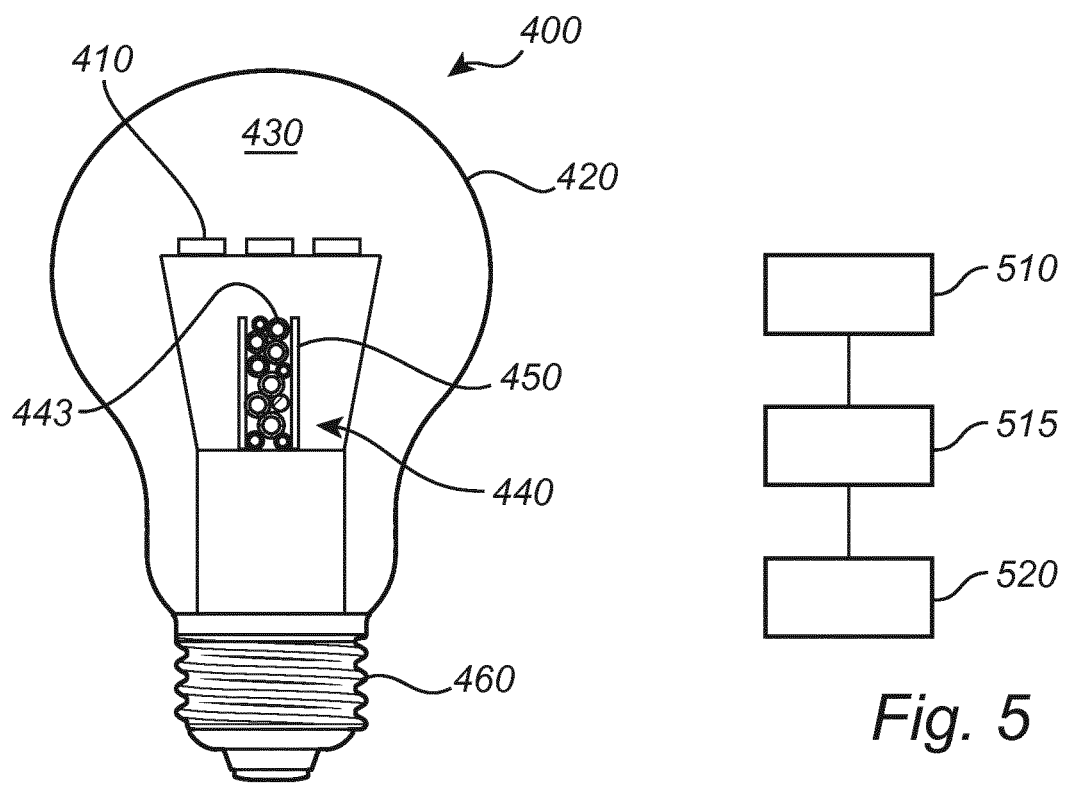
Fig. 4
Fig. 5

LIGHTING DEVICE WITH DISPENSER FOR A REACTIVE SUBSTANCE

CROSS-REFERENCE TO PRIOR APPLICATIONS

This application is the U.S. National Phase application under 35 U.S.C. § 371 of International Application No. PCT/EP2016/053259, filed on Feb. 16, 2016, which claims the benefit of European Patent Application Nos. 15195790.9, filed on Nov. 23, 2015 and 15156778.1, filed on Feb. 26, 2015. These applications are hereby incorporated by reference herein.

FIELD OF THE INVENTION

The present invention generally relates to the field of lighting devices comprising a light transmitting envelope, defining a sealed space, and a dispenser for release of a chemically reactive substance.

BACKGROUND OF THE INVENTION

The envelope of lighting devices may be filled with a thermally conducting gas so as to provide cooling of light sources, such as e.g. light emitting diodes (LEDs), arranged within the envelope. One drawback with such technologies is however that the light source may age prematurely due to by-products and contaminants from e.g. the light source, which are released within the enclosure and may deposit on e.g. light emitting portions of the light source. As the light source is gradually obscured by the deposited contaminants, performance of the light source may degrade in terms of e.g. colour distribution and light intensity.

WO 2013/154932 addresses this issue by including oxygen in the enclosure, since oxygen has been discovered to lower or eliminate the contaminants. It is however difficult to determine a suitable amount of oxygen, since too high concentrations of oxygen may reduce the cooling performance of the lighting device and too low concentrations may not be sufficient to reduce or eliminate the contaminants.

Hence, there is a need for improved lighting devices which are capable of reducing contamination and degradation of the light source. There is also a need for lighting devices having an increased life.

SUMMARY OF THE INVENTION

It would be advantageous to achieve a lighting device overcoming, or at least alleviating, the above mentioned drawbacks. In particular, it would be desirable to provide a light source having a reduced tendency of contamination of the light source and an increased life.

To better address one or more of these concerns, a lighting device having the features defined in the independent claims is provided. Preferable embodiments are defined in the dependent claims.

Hence, according to a first aspect, a lighting device is provided. The lighting device comprises a light source and an at least partially light transmitting envelope arranged to define a sealed space in which at least a portion of the light source may be arranged. Further, the lighting device comprises a dispenser adapted to gradually release a chemically reactive substance to the sealed space.

According to a second aspect, a method of manufacturing a lighting device is provided. The method comprises arranging a dispenser within an at least partially light transmitting envelope, wherein the envelope is arranged to at least partly enclose a light source, and sealing the envelope such that it defines a sealed space. The dispenser is adapted to gradually release chemically reactive substance to the sealed space.

According to the present aspects, the dispenser may act as a source that gradually supplies a chemically reactive substance to the sealed space during at least a part of the life of the lighting device. In other words, the reactive substance may be released to the sealed space after manufacturing of the lighting device, i.e. after the envelope has been sealed. Hence, reactive substance that is consumed in the sealed space, e.g. by reacting with by-products, contaminants and/or a substrate supporting the light source, may be replenished or replaced by reactive substance from the dispenser.

An advantage with the present disclosure consists in that the risk of depletion of reactive substance in the sealed space (i.e. the envelope) may be reduced, which may reduce the risk of premature aging or degradation of the light source. Another advantage over prior art devices consists in that the initial amount of reactive substance, i.e. the amount of reactive substance added to the sealed space during manufacturing of the lighting device, may be reduced. A reduced amount of reactive substance may improve the heat dissipating performance of the lighting device, in particular in case of use of reactive substances with a relatively low thermal conductivity. By gradually releasing the reactive substance to the sealed space, the amount or concentration of the reactive substance in the sealed space may be kept at a relatively low and/or constant level.

The gradual release of the reactive substance should be understood as a small flow or supply of substance progressing slowly or by degrees over a prolonged period of time, such as months or years or during the entire life of the lighting device. The release may be continuous or steady, may vary over time or be discontinuous or intermittent. In one example, a release rate may be increased during operation of the lighting device, i.e. when the light source emits light, and be reduced or ceased when the lighting device is not in use. The rate of the gradual release may in some embodiments be based on, or related to, an actual or current amount or concentration of contaminants in the sealed space, and/or a temperature of the lighting device or the dispenser.

The dispenser may be realised by any material, device or means capable of containing, carrying or accommodate at least some of the reactive substance for a prolonged period of time. The dispenser may e.g. be formed of or comprise a material, such as a solid compound, comprising the chemically reactive substance. In one example, the dispenser may comprise or be formed of a compound that is capable of releasing reactive substance during a decomposition process of the compound. Further, the dispenser may be integrated in other parts of the lighting device, such as a reservoir, the envelope, the light source or any holding or support means, or arranged as a separate part or device within the sealed space or via a fluid connection with the sealed space.

In the context of the present application, the term "dispenser" may be interchangeably used with terms such as "dispensing means", "dispensing unit", "substance releasing unit" and "substance releasing material".

In the present specification, the term "chemically reactive substance" or "reactive substance" may include substances, such as e.g. compounds and elements, having a tendency to react chemically, i.e. to interact and undergo a chemical or physical change. In particular, it may refer to substances causing by-products or contaminants in the sealed space or on the light source to undergo a chemical or physical change.

The envelope may be arranged to receive at least some of the light emitted from the light source via an inner surface at least partly facing the sealed space and the light source, and to output light from the light source via an outer surface of the envelope. Further, the envelope may be sealed so as to form a barrier preventing, or at least reducing, passage of gas and liquid from the sealed space to the surroundings of the lighting device and vice versa. The sealing may also be referred to as a hermetic sealing. The envelope may e.g. be realised or shaped as a bulb of an incandescent light bulb or as a tube of a fluorescent tube.

According to an embodiment, the dispenser may be formed of or comprise a reservoir having at least a portion that is at least partially permeable to the chemically reactive substance. In other words, the reservoir may be adapted to allow at least some of the reactive substance to be released to the sealed space by passing through the portion of the reservoir, e.g. via a permeable material of which the reservoir is formed. In one example, the reservoir may comprise a permeable wall, wherein the permeability may be adjusted or determined by the thickness of the wall and/or passages such as through-holes of the wall. A permeable reservoir may reduce or eliminate the need for additional or separate release rate controlling structures or devices.

According to an embodiment, the dispenser or reservoir may comprise a porous material adapted to gradually release at least some of the chemically reactive material. The porous material may comprise minute interstices that may accommodate reactive substance and be adapted to let the reactive substance pass through them. A porous material capable of holding or storing at least some of the reactive substance allows for the reservoir to be formed as a solid piece of the porous material. The porous material may also be arranged in a reservoir wall, defining a void or container accommodating some of the reactive substance, and allow reactive substance to percolate or pass through the porous material and to the sealed space.

According to an embodiment, the dispenser or reservoir may comprise a cellular material, such as e.g. a foam, wherein at least some of the reactive substance may be contained in one or several of a number of cells of the cellular material.

According to some embodiments, the chemically reactive substance may be an oxidizing substance such as e.g. oxygen, and in particular diatomic oxygen gas. Oxygen is advantageous in that it is reactive and may form compounds, such as oxides, with most elements and a great variety of compounds. In particular, oxygen has proved to efficiently react with by-products and contaminants present in the sealed enclosure of the lighting device. Further examples of oxygen include peroxide, ozone and other allotropes of oxygen. The oxygen may also be released in the form of an compound comprising oxygen.

According to some embodiments, at least a portion of the dispenser or reservoir may be formed of, or comprise a coating. The coating may be provided to regulate the release rate of the reactive substance, e.g. by providing a coating having a desired or particular reactive substance permeability. The permeability and hence the release rate of the reservoir may e.g. depend on the thickness of the coating, any defects such as pinholes, and the general ability of the coating material to let the reactive substance through. The coating may e.g. include a polymeric material or an inorganic material. Suitable polymeric materials may include synthetic polymers such as acrylates, polyethylene and silicone. Examples of inorganic materials may include metal oxides, nitride, phosphide and sulphide.

The coating may be formed by means of e.g. layer deposition techniques such as atomic layer deposition, chemical vapour deposition (CVD) or physical vapour deposition (PVD).

According to an embodiment, the reservoir may be defined by an enclosing wall. Thus, the reservoir may be formed as a capsule, such as an enclosed hollow sphere or cylinder. Forming the reservoir by an enclosing wall, or, in other words, as a hollow body, allows for the release rate of reactive substance through the wall to be determined by the volume to surface ratio of the reservoir. The smaller ratio, the more of the reactive substance may access the wall and is hence allowed to pass through the wall. The present embodiment therefore allows for the release rate of reactive substance to be adjusted or chosen by varying the size of the reservoir, and in particular by varying the ratio of volume to surface area of the reservoir.

In one example, the wall of the reservoir may be provided with a through-hole, such as a passage or pinhole, which may be adapted to release reactive substance from the reservoir to the sealed space. The release rate, or amount of reactive substance being released over time, may be determined by the length of the passage and/or the thickness of the wall, the width or cross sectional dimension of the passage, and the number of passages provided.

According to an embodiment, the dispenser may comprise a material that is adapted to gradually release a chemically reactive substance by means of thermal decomposition. The material may e.g. be an oxygen releasing material that may chemically decompose into oxygen, or a compound comprising oxygen, and at least one other component when exposed to heat. The thermal decomposition may be induced at temperatures being equal to or exceeding a thermal decomposition temperature, which should be understood as the temperature required for initiating the decomposition of a e.g. oxygen releasing material. The oxygen releasing material may be chemically stable, or at least less prone to decompose or release oxygen, at temperatures below the thermal decomposition temperature. The present embodiment hence allows for a lighting device wherein the release of oxygen to the sealed space may be controlled by the temperature of the lighting device, and in particular by the amount of heat provided to the dispenser and the oxygen releasing material. Hence, by heating the lighting device the amount or ratio of oxygen in the sealed space may be increased. The heating may e.g. be performed in a heat treatment or curing step during manufacturing of the lighting device, and/or during use of the lighting device. In one example, the heat generated by the light source during operation of the device may be sufficient to initiate the decomposition of the oxygen releasing material and hence allow for oxygen to be released to the sealed space. An increase of temperature of the lighting device may increase both the oxygen consumption in the sealed space and the oxygen release from the oxygen releasing material. The present embodiment hence allows for a compensation or replenishment of consumed oxygen at increased temperatures.

According to some embodiments, the thermal decomposition temperature of said material may be below 200° C., such as below 150° C. or even below 100° C. The release of reactive substance, such as e.g. oxygen, may thereby be induced by heat generated by the light source so as to allow a replenishment of reactive substance during operation of the lighting device, at the same time as the lighting device may be operated at relatively low temperatures. Relatively low operating temperatures are of particular interest when using heat sensitive light sources, such as e.g. light emitting diodes and other semiconductor based light sources, so as to allow for increased life length and a maintained optical performance.

According to some embodiments, the thermal decomposition temperature of said material may be above room temperature, such as above 100° C. Reactive substance may thereby be released to the sealed space when the lighting device is heated, e.g. during operation, while no reactive substance, or at least less amount of reactive substance may be released when the lighting device is not used. The shelf life of the lighting device, i.e., the length of time for which the lighting device may be stored without the reactive substance releasing material being depleted, may thereby increase.

According to an embodiment, the dispenser may be formed of, or comprise, a reactive substance releasing material comprising silver oxide, such as silver (I,III) oxide (Ag4O4), which may release e.g. oxygen gas upon decomposition. Other suitable materials for release of oxygen may comprise e.g. potassium oxide (K2O) and magnesium peroxide (MgO2).

According to an embodiment, the dispenser may be embedded in a matrix material. The dispenser may e.g. be formed as capsules of a reactive substance releasing material that are incorporated in the matrix material, or as reservoirs formed as voids or hollows in the matrix material. The matrix material may e.g. include polymers.

According to an embodiment, the dispenser may be arranged in the vicinity of the light source such that heat generated during operation of the light source may increase the temperature of the dispenser. Heating the reactive substance releasing material allows to the thermal decomposition temperature to be reached and reactive substance (such as e.g. oxygen) to be released to the sealed space. In case of a reservoir, the heating may allow for the release rate of the reactive substance to be increased due to e.g. an increased pressure of the reactive substance in the reservoir, an increased permeability of the reservoir, a reduced viscosity of the reactive substance, or an increased mobility of particles or molecules of the reactive substance. An increased release of reactive substance during operation of the lighting device may allow the amount of reactive substance in the sealed space to meet an increased release or production of by-products and contaminants during operation.

According to an embodiment, the lighting device may comprise an inlet tube arranged to lead to the sealed space and adapted to receive or accommodate the dispenser. The inlet tube may e.g. be adapted for supplying a gas, such as e.g. helium, to the sealed space during manufacturing of the lighting device. In one example, the dispenser may be arranged in the inlet tube prior to the inlet tube is arranged in the sealed space. The reservoir and the inlet tube may hence be provided or pre-assembled in a prior process or manufacturing step.

According to an embodiment, the light source may include a solid state based light source, such as e.g. a light emitting diode, LED, or a laser diode. It will however be understood that the light source may in principle comprise any kind of element that is able to generate and emit light. RGB LEDs may advantageously be used to enable dynamic colour light output from the lighting device. The lighting device may comprise one or several light sources which may be of the same type or different types.

According to an embodiment, the lighting device may be provided with a reactive substance releasing material, such as e.g. an oxygen releasing material, wherein the lighting device may be exposed to a temperature at which the oxygen releasing material may decompose so as to release oxygen to the sealed space. This may e.g. be performed during manufacturing of the lighting device, e.g. in a step performed after sealing of the envelope, in order to provide a desired amount of oxygen to the sealed space. In one example, the envelope may be filled with helium prior to sealing of the sealed space and heated at least to the thermal decomposition temperature of the oxygen releasing material so as to add oxygen to the sealed space. The added amount of oxygen may e.g. amount to 0.5% of the total volume of the sealed space. Additionally, or alternatively, additional oxygen (and/or other types of gasses) may be provided prior to sealing of the envelope.

It will be appreciated that the dispenser may comprise a reservoir that may be formed of a material comprising e.g. an inorganic material such as SiO2 or SiN2, or a polymeric material including e.g. polyethylene terephthalate (PET), polyethylene naphthalate (PEN), polyvinylidene chloride (PVDC), polyvinylidene fluoride (PVDF), ethylene vinyl alcohol (EVOH), polybutylene terephthalate (PBT), polyacrylonitrile (PAN), and nylon 6 (PA6).

It is noted that embodiments of the invention relates to all possible combinations of features recited in the claims. Further, it will be appreciated that the various embodiments described for the device are all combinable with embodiments the method as defined in accordance with the second aspect.

BRIEF DESCRIPTION OF THE DRAWINGS

This and other aspects will now be described in more detail with reference to the appended drawing showing some embodiments.

FIG. 3 show a cross section of a lighting device according an embodiments.

FIG. 4 show a cross section of a lighting device according another embodiment.

FIG. 5 is a flow chart illustrating a method of manufacturing a lighting device according to some embodiments.

All the figures are schematic, not necessarily to scale, and generally only show parts which are necessary in order to elucidate the embodiments, wherein other parts may be omitted or merely suggested. Like reference numerals refer to like elements throughout the description.

DETAILED DESCRIPTION

The present aspects will now be described more fully hereinafter with reference to the accompanying drawings, in which currently preferred embodiments are shown. This invention may, however, be embodied in many different forms and should not be construed as limited to the embodiments set forth herein; rather, these embodiments are provided for thoroughness and completeness, and fully convey the scope of the present aspects to the skilled person.

Figure 1:
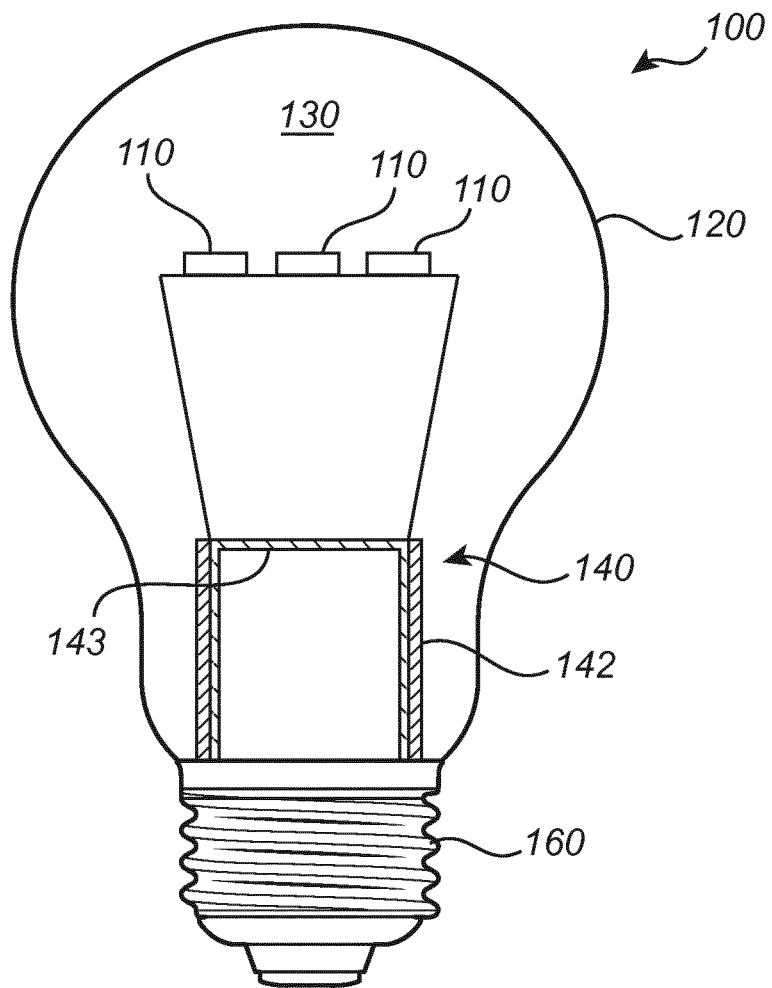
FIG. 1 shows a cross section of a lighting device according to an embodiment.

A lighting device according to an embodiment will be described with reference to FIG. 1.

The lighting device 100 comprises a light source 110, such as e.g. three LEDs, arranged in a sealed space 130 formed by an at least partially light transmitting envelope 120. The envelope 120 may e.g. be bulb-shaped or tube-shaped, and may e.g. be formed of glass or plastic. The envelope 120 may be arranged to accommodate the light source 110 and may be sealed to a base 160 of the lighting device 100 so as to define the sealed space 130. The sealed space 130 may comprise a gas, such as e.g. helium and/or hydrogen, for facilitating heat transport from the light source 110 to the surroundings of the lighting device 100 via e.g. the envelope 120.

Further, a dispenser 140 may be arranged within the sealed space 130, or be in fluid communication with the sealed space, so as to allow a reactive substance such as e.g. oxygen gas to be released from the reservoir 140 to the sealed space 130. According to the present embodiment, the dispenser may be formed as a reservoir 140 and may be arranged close to the base 160 of the lighting device 100.

The reservoir 140 may be defined by an enclosing wall 143 which e.g. may be formed of, or may comprise, a material that is at least partially permeable to oxygen so as to provide a gradual release or supply of oxygen from the reservoir 140 to the sealed space 130 via the wall 143. The wall 143 may e.g. comprise a porous material and/or a plastic material.

A coating 142 may be provided to at least a portion of a surface of the reservoir 140. The coating may be provided on an outer surface of the reservoir 140, i.e. a surface facing the sealed space 130, and/or an inner surface. The coating 142 may e.g. be provided by a deposition method, such as e.g. PVD or CVD, and may be adapted to regulate or adjust an oxygen release rate or a permeability of the wall 143.

Alternatively, or additionally, the dispenser may be formed of, or comprise, a material that is adapted to chemically decompose and thereby release a reactive substance such as e.g. oxygen gas. Such an oxygen releasing material may e.g. comprise silver (I,III) oxide, Ag4O4, and may be adapted to decompose into, i.a., oxygen as the temperature of the oxygen releasing material reaches a thermal decomposition temperature. The thermal decomposition temperature may e.g. be in the range of 100-150° C.

Figure 2A:
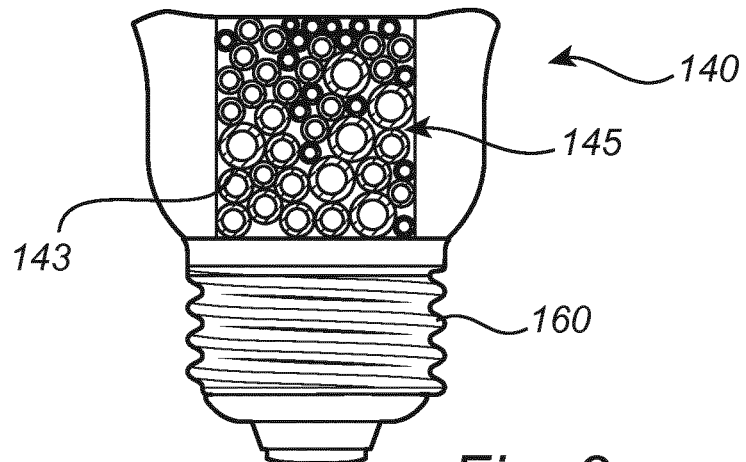
FIG. 2*a-c* show cross sections of the reservoir in FIG. 1 according to some embodiments.
Figure 2B:
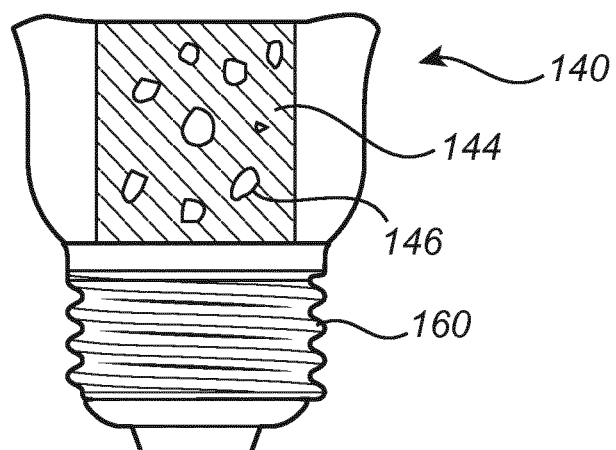
Figure 2C:
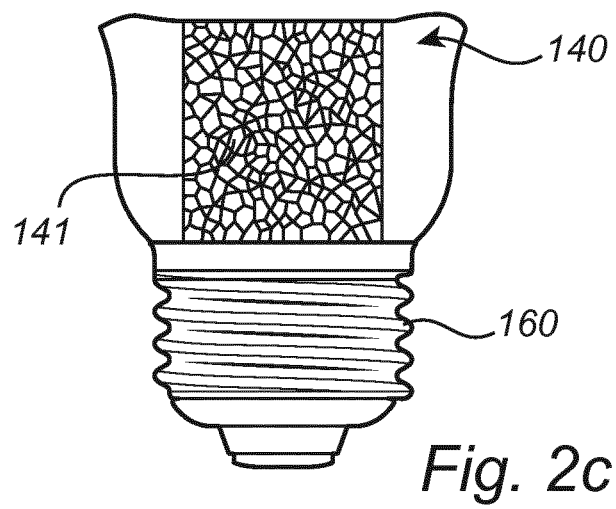

Initially, the reservoir 140 may be filled or provided with oxygen and arranged in the sealed space 130. During at least part of the life of the lighting device 100, the oxygen may be gradually released or supplied to the sealed space 130 by the reservoir 140, e.g. by passing or being admitted through the wall 143 and/or coating 142 of the reservoir 140. The released oxygen may react with contaminants within the sealed space 130 and/or contaminants deposited on or at the light source 110 so as to eliminate or at least reduce the contaminants. It will however be appreciated that at least some of the oxygen may be stored or accommodated in a material forming the wall 143, from which the oxygen may be gradually released. FIG. 2a-c show cross sectional portions of reservoirs of lighting devices which may be similarly configured as the lighting device 100 described with reference to FIG. 1.

As shown in FIG. 2a, the dispenser 140 may be formed as a reservoir comprising one or several capsules 145, such as e.g. hollow spheres or cylinders, formed by the enclosing wall 142. A capsule 145 may be adapted to accommodate at least some oxygen and to gradually release oxygen to the sealed space 130. The volume of a capsule may e.g. be in the range of 1 nanolitre to 20 millilitres.

According to FIG. 2b, the reservoir 140 may comprise or be formed of capsules or voids 146 embedded in a matrix material 144. The voids 146, which e.g. may have a volume in the range of e.g. 1 nanolitre to 20 milliltres, may comprise oxygen, which may be released to the sealed space 130 by passing through the matrix material 144, which may be porous or permeable to the oxygen.

FIG. 2c shows another example, wherein the reservoir 140 may comprise a cellular material (i.e. a material with cells) such as e.g. a foam. Oxygen may be provided in one or several of the cells 141 of the cellular material and may be released to the sealed space via a permeable wall or membrane of a cell 141.

The occupation of the volume of oxygen gas to a total volume of gas (such as e.g. helium) in the sealed space, or the total volume of the sealed space, may represent less than 0.5%, such as less than 0.3% or less than 0.2%. The ratio of the volume of oxygen gas to the total volume may be increased by curing the lighting device at the thermal decomposition temperature or higher.

In one example, an initial volume concentration of oxygen gas in a reservoir may be higher than 60%, such as higher than 70% or higher than 80%.

It will however be appreciated that the reservoir 140 in any one of the embodiments described with reference to FIG. 2a-c may be provided or filled with e.g. an oxygen releasing material that is adapted to gradually release oxygen upon thermal decomposition.

FIG. 3 is a cross sectional side view of a similar lighting device as the lighting device 100 described with reference to FIG. 1. In FIG. 3, the lighting device 300 may comprise a tube-shaped envelope 320 defining the sealed space 330 in which a light source 310 is arranged. The light source may comprise an array of LEDs 310 that may be arranged on a support member 312 extending along the tube 310. The support member 312 may be provided with one or several dispensers, such as reservoirs 340 with e.g. oxygen gas and/or an oxygen releasing material. As indicated in FIG. 3, the dispensers 340 may be embedded or enclosed in the support member 340, but may as an alternative, or in addition, be arranged as separate parts within or at the support member 340 and close to the light source.

By arranging a dispenser 340 close to the light source 310, the dispenser may be heated by the light source 310 during operation of the lighting device 300. By heating a dispenser 310, oxygen may be released and/or the oxygen release rate increased with the increased temperature of the oxygen and/or the dispenser 340.

A lighting device according to another embodiment will be described with reference to FIG. 4. The lighting device 400 may be similarly configured as the lighting devices 100 and 300 described with reference to FIGS. 1 and 3, respectively, but may according to the present embodiment be also equipped with an inlet tube 450 for supplying a gas to the sealed space 430 during e.g. manufacturing of the lighting device 400. The inlet tube 450 may e.g. extend from the base 460 of the lighting device 400 towards the light source 410, and may comprise one or more dispensers 140, such as reservoirs 440 for releasing a chemically reactive substance, such as oxygen gas, to the sealed space 430 after manufacturing of the lighting device 400. As shown in FIG. 4, the inlet tube 450 may accommodate or be filled with a plurality of reservoirs 440, which may be formed as capsules 440 enclosed by a wall 443. Alternatively, or additionally, a material adapted to release a reactive substance may be arranged on or within the inlet tube 450. During the gradual release of reactive substance, such as e.g. oxygen, released oxygen may slowly flow or move within the inlet tube 450 towards the light source 410 and enter the sealed space 430 at an end orifice of the inlet tube 450.

FIG. 5 is a flow chart illustrating a method 500 of manufacturing a lighting device according to some embodiments. The lighting device may be similarly configured as the lighting devices described with reference to FIGS. 1, 3 and 4.

The method 500 comprises the steps of arranging 510 a dispenser within an at least partially light transmitting envelope, wherein the envelope is arranged to at least partly enclose a light source, and sealing 515 the envelope such that it defines a sealed space. The dispenser may comprise a chemically reactive substance, and may be adapted to gradually release at least some of the chemically reactive substance to the sealed space.

According to an embodiment, the method 500 may further include a step of exposing 520 the dispenser to a temperature equal to or above a thermal decomposition temperature of the material of the dispenser so as to release reactive substance to the sealed space.

According to an embodiment, the method 500 may further include a step of filling 520 the sealed space, or the enclosure defined by the envelope and which is to be sealed, with a gas comprising e.g. helium and/or hydrogen for increasing the thermal conductivity within the sealed space. The gas may be supplied to the lighting device by means of an inlet tube as previously described with reference to FIG. 4.

In one study, the sealed space was filled with helium and provided with 100 mg of Ag4O4. The lighting device was then heated to 100° C. for 55 hours so as to release oxygen to the sealed space. The amount of released oxygen was in this present study found to amount to 0.5% of the total volume of the sealed space.

In conclusion, a lighting device is disclosed. The lighting device comprises a light source, an at least partially light transmitting envelope and a dispenser. The envelope is arranged to define a sealed space in which at least a portion of the light source is arranged. Further, the dispenser comprises a chemically reactive substance and is adapted to gradually release at least some of the chemically reactive substance to the sealed space so as to reduce contaminants and by-products that may be present in the sealed space.

The person skilled in the art realizes that the present invention by no means is limited to the preferred embodiments described above. On the contrary, many modifications and variations are possible within the scope of the appended claims. For example, the dispenser may be formed as a reservoir and/or of a material adapted to gradually release a chemically reactive substance, and may be arranged at any position from which it is allowed to supply at least some of the chemically reactive substance to the sealed enclosure. The dispenser may also be formed of any suitable material capable of accommodating or storing at least some of the chemically reactive substance, and may be provided any suitable form or structure.

Additionally, variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A lighting device comprising:
a light source;
an at least partially light transmitting envelope arranged to define a sealed space in which at least a portion of the light source is arranged;
a dispenser arranged in the sealed space, said dispenser comprising an oxidizing substance;
wherein the dispenser is adapted to gradually release at least some of the oxidizing substance to the sealed space; and
wherein the dispenser comprises a reservoir having a portion that is at least partially permeable to the oxidizing substance.

2. The lighting device according to claim 1, wherein the reservoir comprises a porous material adapted to gradually release at least some of the oxidizing substance.

3. The lighting device according to claim 1, wherein the dispenser comprises a cellular material adapted to contain at least some of the oxidizing substance.

4. The lighting device according to claim 1, wherein at least a portion of the reservoir comprises a coating comprising a polymer, a metal oxide, a nitride, a phosphide, or a sulphide.

5. The lighting device according to claim 1, wherein the dispenser is arranged in the vicinity of the light source.

6. The lighting device according to claim 1, wherein the light source includes a light emitting diode or a laser diode.

7. The lighting device according to claim 1, wherein the envelope is bulb-shaped or tube-shaped.

8. A lighting device comprising:
a light source;
an at least partially light transmitting envelope arranged to define a sealed space in which at least a portion of the light source is arranged;
a dispenser arranged in the sealed space, said dispenser comprising an oxidizing substance;
wherein the dispenser is adapted to gradually release at least some of the oxidizing substance to the sealed space, wherein the oxidizing substance includes oxygen.

9. A lighting device comprising:
a light source;
an at least partially light transmitting envelope arranged to define a sealed space in which at least a portion of the light source is arranged;
a dispenser arranged in the sealed space, said dispenser comprising an oxidizing substance;
wherein the dispenser is adapted to gradually release at least some of the oxidizing substance to the sealed space, wherein the dispenser comprises a material that is adapted to gradually release a oxidizing substance by means of thermal decomposition.

10. The lighting device according to claim 9, wherein a thermal decomposition temperature of said material is below 200° C. and/or above room temperature.

11. The lighting device according to claim 9, wherein said material comprises Ag4O4, K2O or MgO2.

12. The lighting device according to claim 9, wherein said material is provided as a coating arranged within the sealed space.

13. A lighting device comprising:
a light source;
an at least partially light transmitting envelope arranged to define a sealed space in which at least a portion of the light source is arranged;

a dispenser arranged in the sealed space, said dispenser comprising an oxidizing substance;

wherein the dispenser is adapted to gradually release at least some of the oxidizing substance to the sealed space; and an inlet tube leading to the sealed space and being arranged to receive the dispenser.

14. A method of manufacturing a lighting device, comprising the steps of:

arranging a dispenser within an at least partially light transmitting envelope, the envelope being arranged to at least partly enclose a light source; and sealing the envelope such that it defines a sealed space;

wherein the dispenser comprises a oxidizing substance and is adapted to gradually release at least some of the oxidizing substance to the sealed space; and wherein the dispenser comprises a reservoir having a portion that is at least partially permeable to the oxidizing substance.

\* \* \* \* \*